US007532131B2

(12) United States Patent
Schaefer et al.

(10) Patent No.: US 7,532,131 B2
(45) Date of Patent: May 12, 2009

(54) MULTI-LAYER SOLID STATE KEYBOARD

(76) Inventors: William David Schaefer, 2121 Finsbury La., Grand Rapids, MI (US) 49504; David W. Caldwell, 16253 Ranson St., Holland, MI (US) 49424

( * ) Notice: Subject to any disclaimer, the term of this patent is extended or adjusted under 35 U.S.C. 154(b) by 105 days.

(21) Appl. No.: 10/829,493

(22) Filed: Apr. 22, 2004

(65) Prior Publication Data

US 2005/0062620 A1 Mar. 24, 2005

Related U.S. Application Data

(63) Continuation-in-part of application No. 10/272,377, filed on Oct. 15, 2002, now Pat. No. 7,218,498.

(60) Provisional application No. 60/464,483, filed on Apr. 22, 2003, provisional application No. 60/341,551, filed on Dec. 18, 2001, provisional application No. 60/334,040, filed on Nov. 20, 2001.

(51) Int. Cl.
*H03K 17/96* (2006.01)

(52) U.S. Cl. ......................... 341/22; 200/5 A; 200/512; 200/600; 345/173

(58) Field of Classification Search .................. 341/22; 200/5 A, 512, 600, 310; 345/168, 173
See application file for complete search history.

(56) References Cited

U.S. PATENT DOCUMENTS

| | | | | |
|---|---|---|---|---|
| 4,035,593 | A * | 7/1977 | Riniker | 200/5 A |
| 4,090,045 | A * | 5/1978 | Marsh | 200/5 A |
| 4,251,734 | A * | 2/1981 | Mayer et al. | 290/5 |
| 4,471,177 | A * | 9/1984 | Doughty | 200/5 A |
| 4,901,074 | A * | 2/1990 | Sinn et al. | 341/22 |
| 5,239,152 | A * | 8/1993 | Caldwell et al. | 200/600 |
| 5,594,222 | A * | 1/1997 | Caldwell | 200/600 |
| 6,137,072 | A | 10/2000 | Martter et al. | |
| 6,585,435 | B2 * | 7/2003 | Fang | 400/479 |
| 6,879,317 | B2 * | 4/2005 | Quinn et al. | 345/168 |
| 7,242,393 | B2 * | 7/2007 | Caldwell | 345/173 |
| 2003/0122794 | A1 | 7/2003 | Caldwell | |
| 2005/0006213 | A1 * | 1/2005 | Engelmann | 200/310 |

FOREIGN PATENT DOCUMENTS

DE 91 12 597 U 6/1992

* cited by examiner

*Primary Examiner*—Timothy Edwards, Jr.

(57) ABSTRACT

A keypad includes a substrate and one or more layers of decorative material on the substrate. Transparent and/or conventional conductive materials are disposed on the decorative material. Electrical circuit components are soldered to the conductive layers.

30 Claims, 7 Drawing Sheets

MULTI-LAYER SOLID STATE KEYBOARD

CROSS-REFERENCE TO RELATED APPLICATION

This application claims priority from U.S. Provisional Patent Application Ser. No. 60/464,483, filed on Apr. 22, 2003, the disclosure of which is incorporated herein by reference. This application further claims priority as continuation-in-part from U.S. Pat. No. 7,218,498, which in turn claims benefit of U.S. Provisional Patent Application No. 60/334,040, filed Nov. 20, 2001, and U.S. Provisional Patent Application No. 60/341,551, filed Dec. 18, 2001.

BACKGROUND OF THE INVENTION

1. The Technical Field

The present invention is directed generally to a solid state keyboard. More particularly, the present invention is directed to a solid state keyboard integrating decorative and functional layers.

2. The Related Art

Keypad input systems typically are assemblies of several components. For example, a typical keypad includes a glass, plastic, or flexible film face plate or front panel that acts as a user interface. This face plate might include graphics that describe the keypad's functionality and/or other indicia, such as a logo, for purely decorative purposes. Such a keypad further includes another panel that includes, for example, field effect sensor electrodes and control circuitry. These two panels typically are manufactured as separate subassemblies that are later joined to form a finished keypad.

Some keypads use reconfigurable keys in connection with a reconfigurable display. One example of such a system includes a dot matrix display that provides prompts to a user and solicits input from the user via one or more mechanical switches, for example, membrane switches, situated about the display and proximate the various prompts. Such a system may guide a user through various menu levels, wherein the displayed prompts corresponding to a particular switch vary from level to level and the function of the switch changes correspondingly. One drawback with such a system is that it is not always clear to the user which switch, if any, is associated with a particular display prompt. Another is that membrane switches, commonly used in such applications, are prone to premature failure when used in high traffic applications.

Computer touch screen technology, as sometimes used in connection with cash register input pads and consumer product information kiosks, offers a better solution, but involves greater cost and complexity. Indeed, such systems typically require PC-based or proprietary decoding hardware. Further, the hardware requirements for such systems prohibit their use in applications where little space is available.

SUMMARY OF THE INVENTION

The present invention is an integrated solid state keypad having multiple layers, including decorative layers and functional layers. The keypad includes one or more keys which preferably are embodied as field effect sensors. In certain embodiments, one or more of the keys are reconfigurable keys that can be used in connection with a reconfigurable display. Preferably, the reconfigurable keys are embodied as field effect sensors having transparent electrode structure.

DETAILED DESCRIPTION OF THE ILLUSTRATED EMBODIMENT

Figure 1:
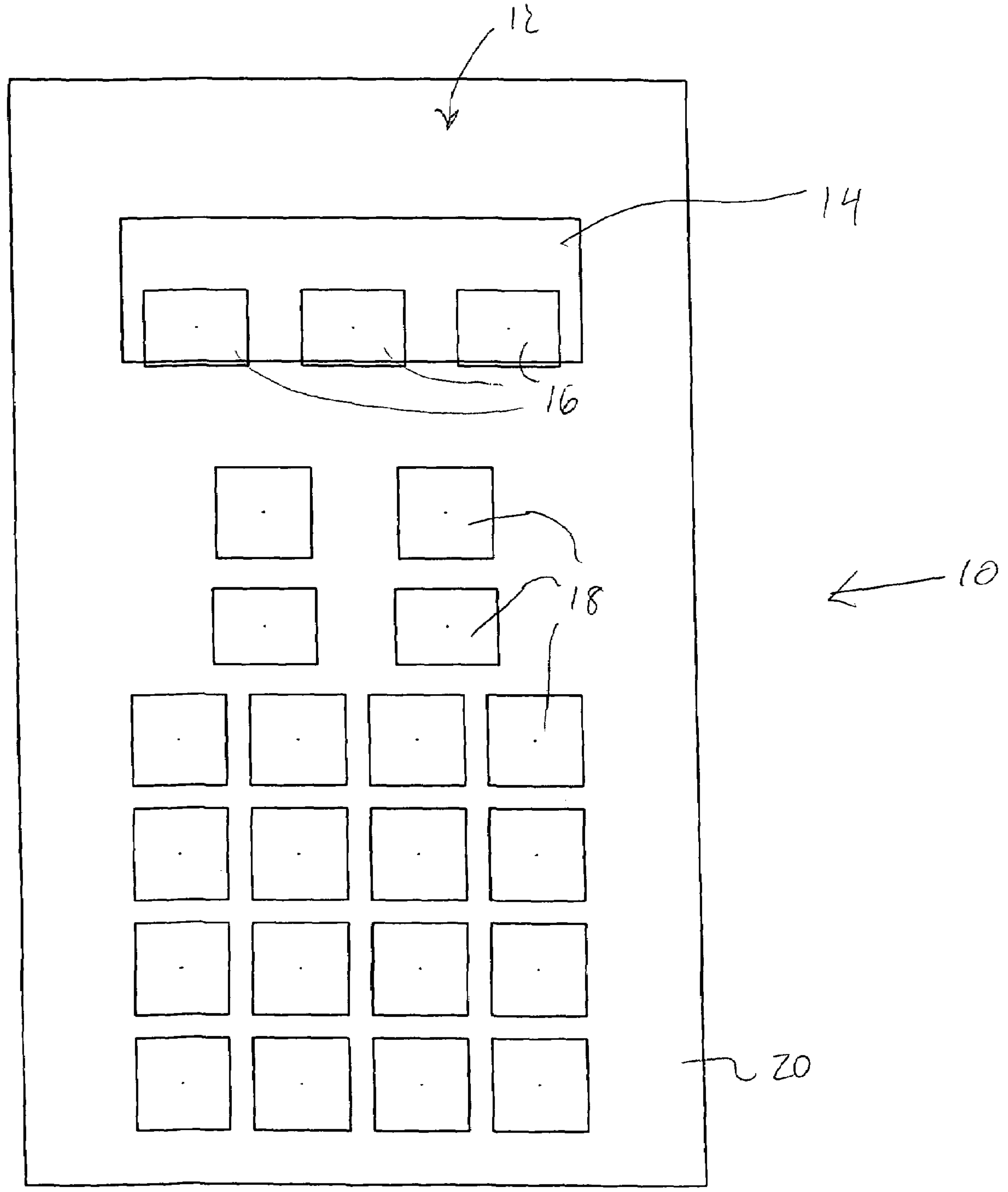
FIG. 1 is a front elevation view of a keypad according to the present invention.

FIG. 1 illustrates the front, or user interface, side 12 of a keypad 10 according to a preferred embodiment of the present invention. Keypad 10 includes a viewing window 14, three reconfigurable keys 16, and twenty non-reconfigurable keys 18 disposed on a substrate 20. Keys 16,18 correspond to field effect sensors, capacitive sensors, or other sensors disposed on the rear side of keypad 10, as will be discussed further below. The precise combination of features illustrated in FIG. 1 is not essential to the invention and is shown for illustration only. Indeed, other embodiments of the invention could have more or fewer viewing windows, reconfigurable keys, or non-reconfigurable keys. Further, some embodiments might lack one or more of these features entirely.

Figure 2:
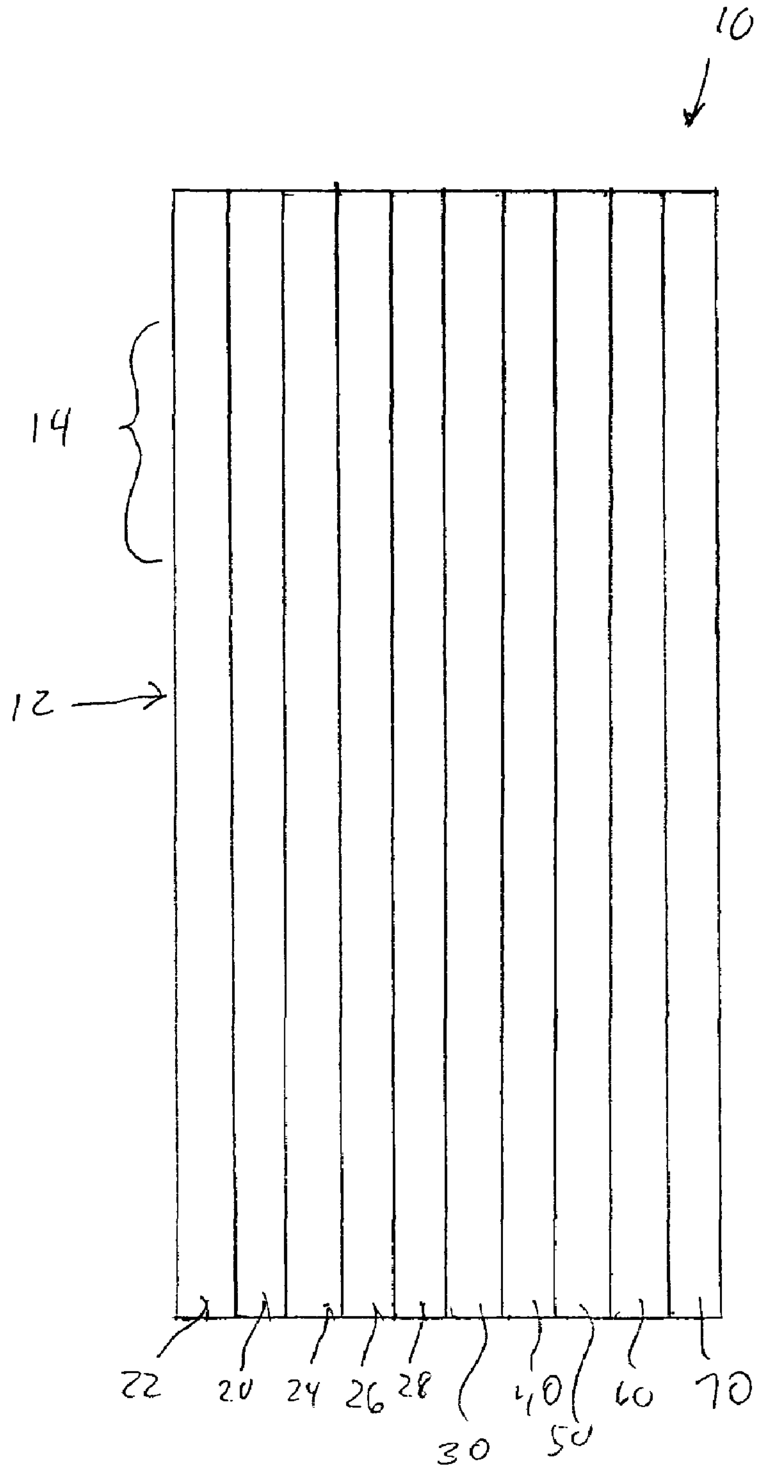
FIG. 2 is a side elevation view of a keypad according to the present invention.

FIG. 2 is a side elevation view showing the various layers comprising keypad 10. FIG. 2 illustrates a preferred arrangement of the various layers. In other embodiments, the various layers can be arranged in other ways and/or sequences, as would be understood by one skilled in the art. Substrate 20, which forms the core of keypad 10, can be any rigid or flexible material suitable for receiving decorative materials and conductive thin films. For example, substrate 20 can be a piece of glass or plastic or a flexible carrier made of polyester.

Layers 22,24,26,28 are layers of decorative material. These decorative material layers can provide functional information, such as graphics depicting the function of a particular key, or purely decorative graphics, for example, a decorative pattern or logo, are applied to one or both sides of substrate 20. FIG. 2 illustrates one decorative layer 22 on the user interface side of substrate 20 and three decorative layers 24,26,28 on the rear side of substrate 20. In other embodiments more or fewer decorative layers can be used on each side of substrate 20.

In preferred embodiments, decorative layers 22,24,26,28 comprise organic decorative materials, for example, screen printed inks, epoxies, and ultraviolet curable materials. Other decorative materials, including inorganic materials, can be used, as well. The various decorative layers can be substantially opaque, translucent, or substantially transparent. In embodiments having viewing window 14, any decoration located within the area of viewing window 14 preferably is substantially transparent so that a user can view a display (not shown) that might be mounted behind viewing window 14 or so that backlighting can be penetrate viewing window 14. Further, decoration located within the area of viewing window 14 can be selected to have certain optical properties so that such decoration acts as an optical filter.

Figure 3:
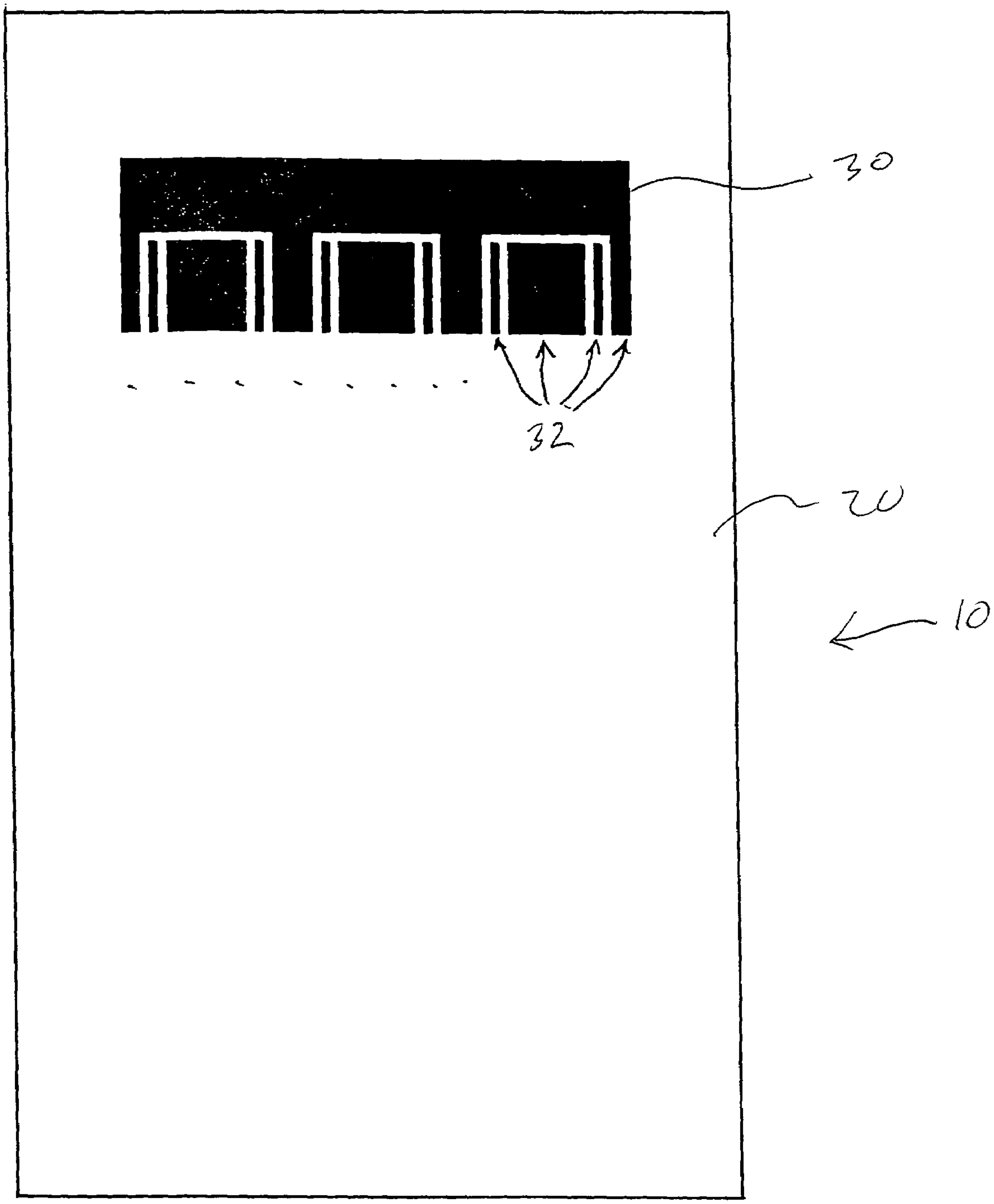
FIG. 3 is a rear elevation view of a keypad according to the present invention, illustrating a transparent conductive layer on a substrate.

Layer 30 is an optional, substantially transparent layer of conductive material. Referring to FIG. 3, transparent conductive layer 30, when used, preferably is configured as transparent electrodes and electrical circuit traces 32. Transparent electrodes and traces 32 can be located anywhere on substrate 20. For example, transparent electrodes and traces 32 can be located on decorated portions of substrate 20, between substrate 20 and the decoration, such that the decoration is viewable through transparent electrodes and traces 32. In applications using backlighting, transparent electrodes and traces 32 can be used in backlit portions to allow the backlighting to reach the user without occlusion as would be the case if electrodes and traces 32 were made of a conventional, opaque material. Referring to FIG. 1, it can be particularly desirable to use transparent electrodes and traces 32 to embody reconfigurable keys 16 or other keys located in the area corresponding to viewing window 14 50 that the output of a display (not shown) mounted behind viewing window 14 is visible to the user.

As discussed further below, electrical circuit components can be coupled to transparent electrodes and traces 32 to form field effect sensors, capacitive sensors, or other sensors. Transparent conductive layer 30 can be applied in various ways. For example, transparent conductive layer 30 can be deposited in a desired pattern using screen printing or microdeposition techniques. Alternatively, transparent conductive layer 30 can be plated or applied as a thin film utilizing, for example, sputtering or thermal evaporation techniques, and then patterned and etched to yield transparent electrodes and traces 32. Other suitable techniques, for example, spin coating, also can be used to apply transparent conductive layer 30, as would be known to one skilled in the art.

FIG. 2 illustrates transparent conductive layer 30 disposed onto decorative layer 28, which ultimately is disposed on substrate 20. Alternatively, transparent conductive layer 30 can be disposed directly onto substrate 20. In such an embodiment, a decorative layer (not shown) optionally can be disposed on transparent conductive layer 30. In embodiments where transparent conductive electrodes and traces 32 are disposed above or below one or more decorative layers, at least the portions of such decorative layers that are coextensive with transparent conductive layer 30 preferably are substantially transparent and can comprise material having optical filtering properties. Preferred materials for transparent conductive layer 30 include, for example, inorganic materials, such as indium tin oxide, or organic materials, such as Baytron PEDOT.

Figure 4:
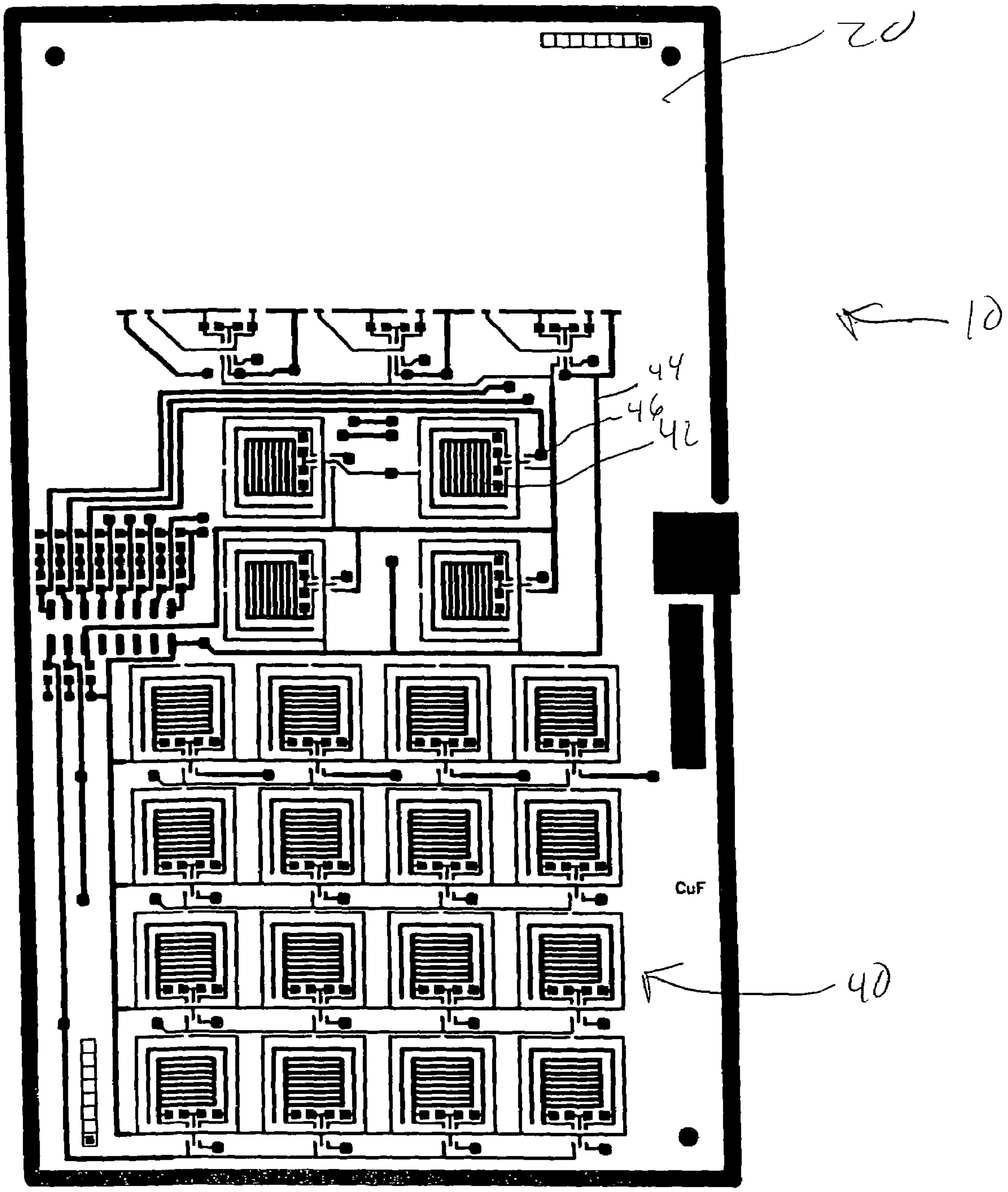
FIG. 4 is a rear elevation view of a keypad according to the present invention, illustrating a conventional conductive layer on a substrate.

Layer 40 is a layer of conventional conductive material disposed on transparent conductive layer 30. Preferably, conventional conductive material layer 40 is made of a polymer thick film silver or copper epoxy, such as that supplied by Acheson Colloids Company of Port Huron, Michigan. In other embodiments, this layer can be made of plated copper or other conductive material. Referring to FIG. 4, conventional conductive layer material 40 preferably is arranged in the form of field effect sensor electrodes 42, electrical circuit traces 44, and bonding pads 46. As discussed further below, electrical circuit components, for example, integrated circuits, transistors, and resistors (not shown), can be coupled to electrodes 42 and traces 44 via bonding pads 46 to form field effect sensors, capacitive sensors, or other sensors. Preferably, such components are connected to bonding pads using conventional soldering techniques. Alternatively, such connections can be made using conductive adhesives, anisotropic adhesives, or other suitable means, as would be known to one skilled in the art. Conventional conductive material layer 40 can be applied using any suitable technique as would be known to one skilled in the art, for example, any of the techniques discussed above in connection with the application of optional transparent conductive layer 30.

Figure 5:
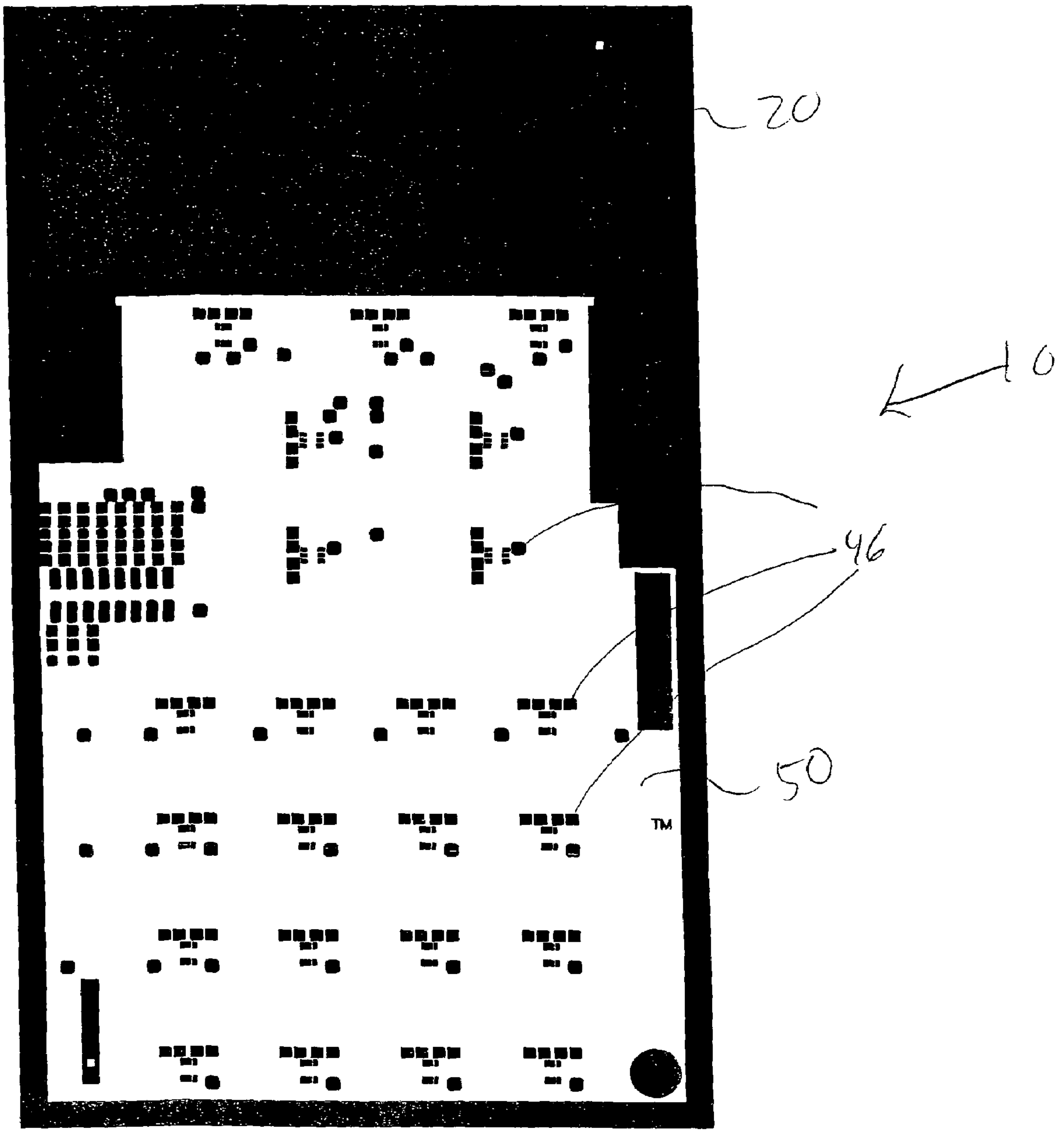
FIG. 5 is a rear elevation view of a keypad according to the present invention, illustrating a solder mask or dielectric layer on a substrate.
Figure 6:
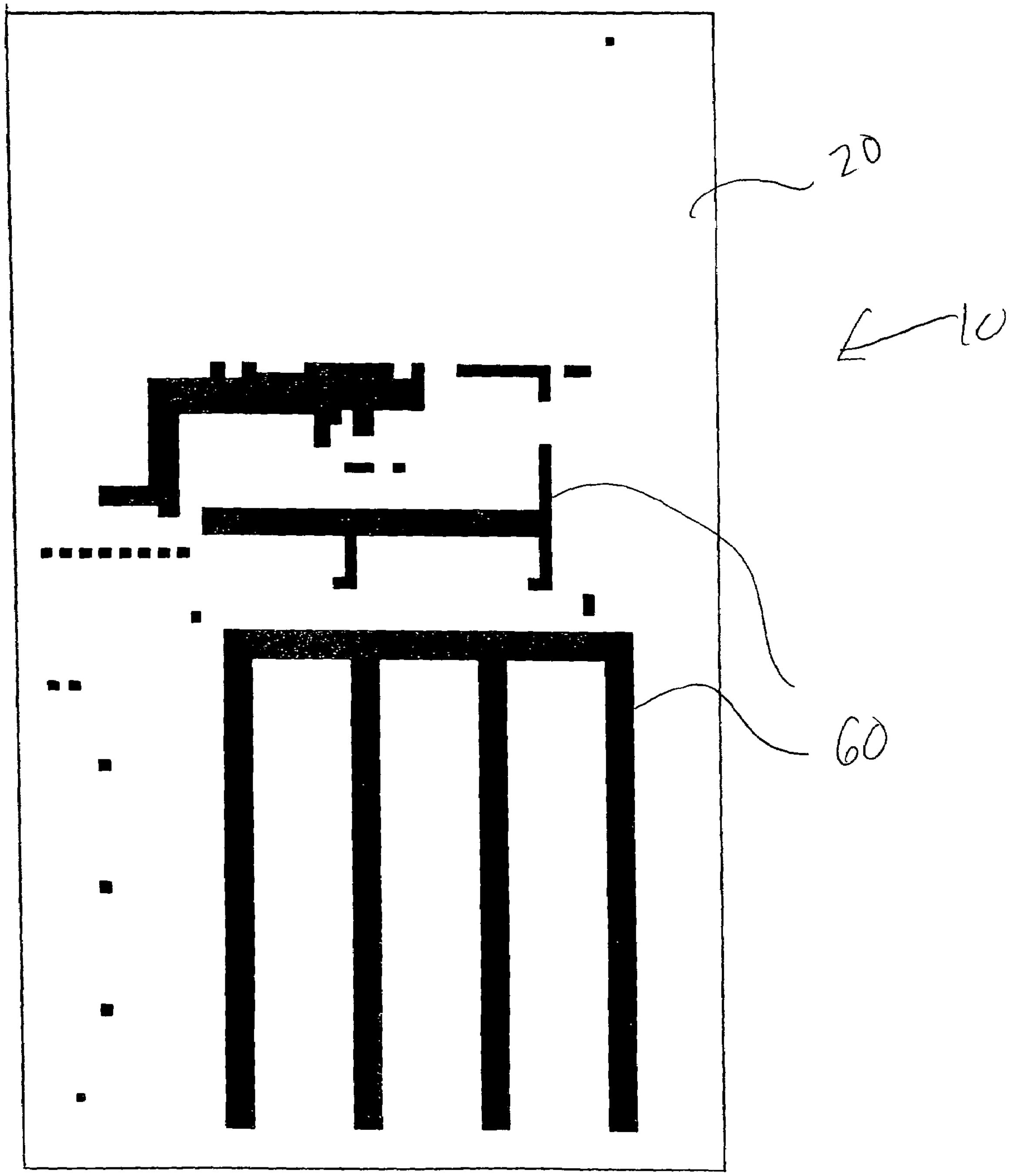
FIG. 6 is a rear elevation view of a keypad according to the present invention, illustrating an additional dielectric layer on a substrate.

Referring to FIGS. 2 and 5, layer 50 is a solder mask/dielectric layer disposed on conventional conductive layer 40 and/or transparent conductive layer 30. Layer 50 provides a solder mask, leaving exposed the portions of conductive layer 40 to which electrical circuit components are to be bonded. For example, solder mask 50 can be designed to leave exposed bonding pads 46 to facilitate bonding of integrated circuits and other electrical components to bonding pads 46. In this manner, field effect sensors or other sensors corresponding to keys 16,18 can be constructed in situ on substrate 20. Although it generally is not preferred to couple such circuit components directly to transparent conductive layer 30, solder mask layer 50 can be designed to leave exposed portions of transparent conductive layer, as necessary, to facilitate such bonding.

Figure 7:
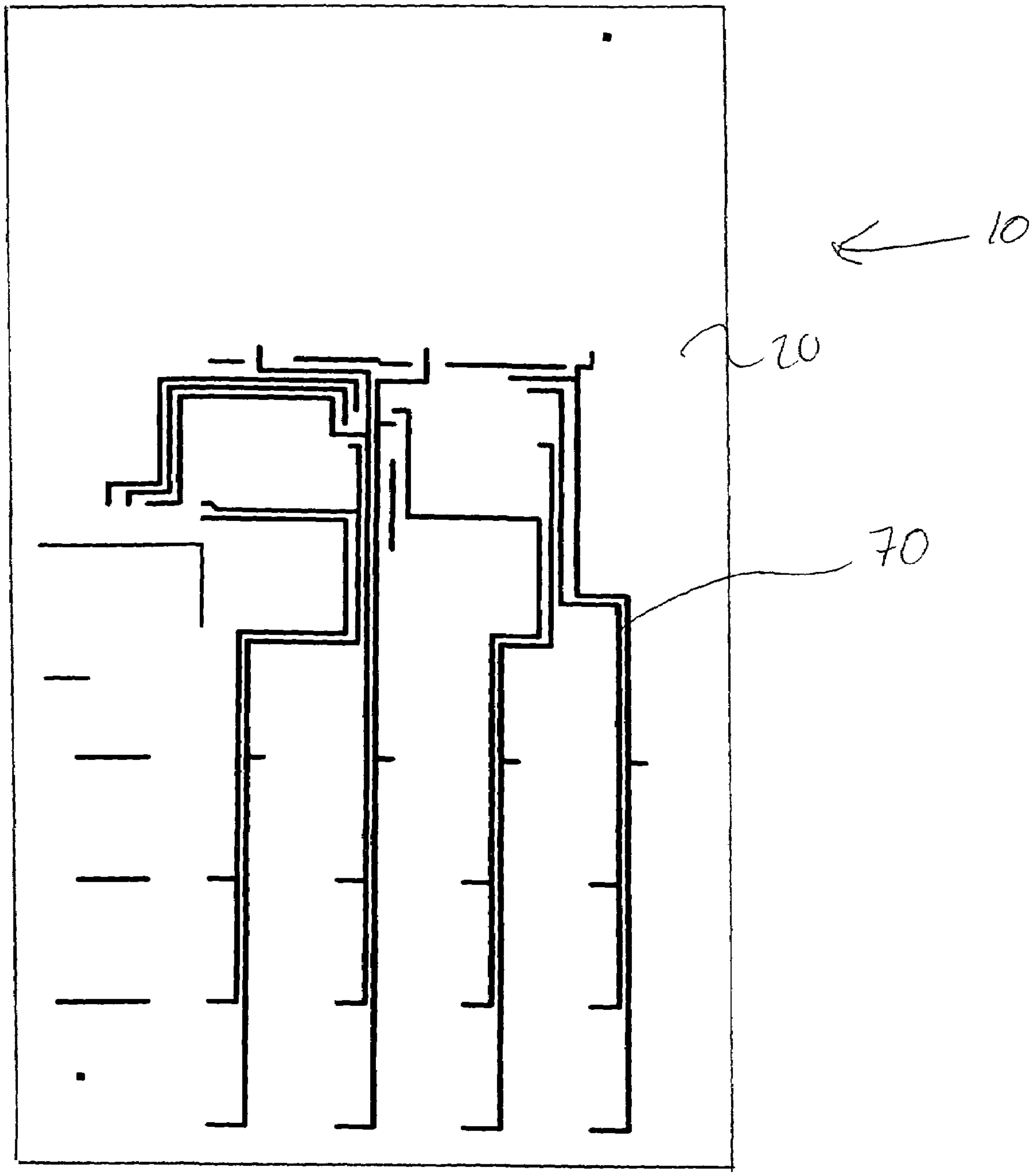
FIG. 7 is a rear elevation view of a keypad according to the present invention, illustrating crossovers for connecting a first conductive layer to a second conductive layer.

Layer 50 also can provide electrical insulation between conventional conductive material layer 40 and transparent conductive layer 30 and further layers of keypad 10. For example, a particular circuit design might require the use of crossovers 70, as illustrated in FIG. 7 and as would be known to one skilled in the art. If layer 50 is selected to have suitable dielectric properties, such crossovers can be applied over layer 50 and bonded at the appropriate points to conventional conductive layer 40 (and/or transparent conductive layer 30, as necessary). In such embodiments, layer 50 insulates crossovers 70 from portions of conventional conductive layer 40 (and/or transparent conductive layer 30, as necessary) which crossovers 70 otherwise would contact, causing the potential for short circuits.

Layer 60 is an optional dielectric layer that can be used in embodiments involving crossovers 70. As discussed above in connection with layer 50, optional dielectric layer 60 provides electrical insulation between electrical crossovers and conductive portions of keypad 10 to be bridged by such crossovers.

A reconfigurable display (not shown) can be disposed on the rear side of keypad 10 adjacent the area corresponding to viewing window 14, allowing a user to view the display through viewing window 14. Such embodiments preferably include reconfigurable keys 14 comprising field effect sensors or other sensors having transparent electrode structure with in the area corresponding to viewing window 14. The functions of such sensors preferably would be reconfigurable, as would be known to one skilled in the art, to conform to the subject matter set forth in the display in the area corresponding to such sensors.

While specific embodiments of the present invention have been shown and described above, it will be obvious to those skilled in the art that numerous modifications made be made without departing from the spirit of the invention, the scope of which is defined by the claims below.

We claim:

1. A solid state keyboard formed by:

(a) depositing a layer of decorative material onto at least a portion of a substrate;

(b) depositing a first layer of conductive material onto at least a portion of the structure resulting from step (a), said first layer of conductive material being arranged in the form of a first sensor electrode;

(c) depositing a second layer of conductive material onto at least a portion of the structure resulting from step (b), at least a portion of said second layer of conductive material overlying and being electrically coupled to at least a portion of said first layer of conductive material, said second layer of conductive material being arranged in the form of a first bonding pad and a first electrical trace coupling said first sensing electrode to said first bonding pad; and (d) connecting a first electrical circuit component to said first bonding pad.

2. The solid state keyboard of claim 1, said second layer of conductive material further being arranged in the form of a second sensor electrode.

3. The solid state keyboard of claim 1 wherein said first layer of conductive material is substantially transparent.

4. The solid state keyboard of claim 1 wherein said step of connecting comprises soldering.

5. The solid state keyboard of claim 1 wherein said substrate separates said layer of decorative material from said first and second layers of conductive material.

6. The solid state keyboard of claim 1 wherein said substrate does not separate said layer of decorative material from said first and second layers of conductive material.

7. The solid-state keyboard of claim 1 wherein said first layer of conductive material is deposited by screen printing and/or microdeposition.

8. The solid-state keyboard of claim 1 wherein said first layer of decorative material comprises an epoxy and said first layer of conductive material is deposited as a thin film onto at least a portion of said layer of decorative material.

9. The solid-state keyboard of claim 1, said second layer of conductive material further arranged in the form of a second sensor electrode, a second bonding pad, and a second electrical trace coupling said second sensor electrode to second bonding pad.

10. The solid-state keyboard of claim 1 wherein said first layer of conductive material is plated and/or deposited as a thin film.

11. The solid-state keyboard of claim 10 wherein said first layer of conductive material is formed by patterning and etching.

12. The solid state keyboard of claim 1 wherein said decorative material comprises an organic material.

13. The solid state keyboard of claim 12 wherein said organic material comprises an epoxy.

14. The solid state keyboard of claim 12 wherein said organic material is ultraviolet curable.

15. The solid state keyboard of claim 1 further formed by depositing a first layer of dielectric material onto at least a portion of the structure resulting from step (c), said first layer of dielectric material overlying at least a portion of one or both of said first layer of conductive material and said second layer of conductive material, said first layer of dielectric material being arranged in a form that enables connecting said first electrical circuit component to said first bonding pad.

16. The solid state keyboard of claim 15, said second layer of conductive material further being arranged in the form of a second bonding pad and said keyboard further formed by depositing a third layer of conductive material onto at least a portion of said first layer of dielectric material.

17. The solid state keyboard of claim 16, at least a portion of said third layer of conductive material being electrically coupled to said second bonding pad.

18. The solid state keyboard of claim 17 further formed by depositing a second layer of dielectric material onto at least a portion of said third layer of conductive material.

19. A solid state keyboard comprising:

a substrate;

at least one layer of decorative material disposed on at least a portion of said substrate;

a thin layer of a first conductive material disposed on at least a portion of said decorative material, said thin layer of a first conductive material being arranged in the form of a first sensor;

a layer of a second conductive material disposed on at least a portion of said thin layer of a first conductive material, said layer of a second conductive material arranged in the form of a second sensor electrode, an electrical trace, and a bonding pad, said electrical trace coupling said second sensor electrode to said bonding pad; and an electrical circuit component connected to said bonding pad.

20. The solid state keyboard of claim 19 wherein said thin layer of a first conductive material is substantially transparent.

21. The solid state keyboard of claim 19 wherein said electrical component is soldered to said bonding pad.

22. The solid state keyboard of claim 19 further comprising a mask disposed on at least a portion of said thin laver4lm of a first conductive material and at least a portion of said layer of a second conductive material, said mask being arranged in a form that enables connecting said electrical circuit component to said bonding pad.

23. The solid state keyboard of claim 19 wherein said decorative material comprises an organic material.

24. The solid state keyboard of claim 23 wherein said organic material comprises an epoxy.

25. A method of making a solid state keyboard comprising the steps of:

(a) depositing a layer of decorative material onto at least a portion of a substrate, either directly or onto an intervening layer of decorative material;

(b) depositing a first layer of conductive material onto at least a portion of the structure resulting from step (a), said first layer of conductive material being arranged in the form of a first sensor electrode;

(c) depositing a second layer of conductive material onto at least a portion of the structure resulting from step (b), at least a portion of said second layer of conductive material overlying and being electrically coupled to at least a portion of said first layer of conductive material, said second layer of conductive material being arranged in the form of a first bonding pad and a first electrical trace coupling said first sensor electrode to said first bonding pad; and (d) connecting a first electrical circuit component to said first bonding pad.

26. The method of claim 25 wherein said at least a first layer of decorative material comprises an epoxy.

27. The method of claim 26 wherein said step of connecting comprises soldering.

28. A solid state keyboard comprising:

a substrate;

a layer of decorative material disposed on at least a portion of said substrate;

a first layer of conductive material disposed on at least a portion of said layer of decorative material, said first layer of conductive material being arranged in the form of a first sensor electrode;

a second layer of conductive material disposed on at least a portion of said first layer of conductive material, said second layer of conductive material being arranged in the form of a first bonding pad and a first electrical trace coupling said first sensing electrode to said first bonding pad; and a first electrical circuit component connected to said first bonding pad.

29. The solid-state keyboard of claim 28, said second layer of conductive material further arranged in the form of a second sensor electrode, a second bonding pad, and a second electrical trace coupling said second sensor electrode to second bonding pad.

30. A solid state keyboard formed by:

(a) depositing a layer of decorative material onto at least a portion of a substrate;

(b) depositing a thin layer of a first conductive material onto at least a portion of said decorative material, said thin layer of a first conductive material being arranged in the form of a first sensor electrode;

(c) depositing a layer of a second conductive material onto at least a portion of said thin layer of a first conductive material, said layer of a second conductive material arranged in the form of a second sensor electrode, an electrical trace, and a bonding pad, said electrical trace coupling said second sensor electrode to said bonding pad; and an electrical circuit component connected to said bonding pad.

* * * * *

UNITED STATES PATENT AND TRADEMARK OFFICE

CERTIFICATE OF CORRECTION

PATENT NO. : 7,532,131 B2
APPLICATION NO. : 10/829493
DATED : May 12, 2009
INVENTOR(S) : William D. Schaefer It is certified that error appears in the above-identified patent and that said Letters Patent is hereby corrected as shown below:

At column 6, line 11, claim 19, insert the word --electrode-- after the word "sensor."

At column 6, line 26, claim 22, delete the term "laver4lm" and insert in its place the word --layer.--.

Signed and Sealed this
Twenty-sixth Day of April, 2011

David J. Kappos
*Director of the United States Patent and Trademark Office*